United States Patent
Ryu

(10) Patent No.: US 8,018,446 B2
(45) Date of Patent: Sep. 13, 2011

(54) DIFFERENTIAL SIGNALING SYSTEM AND DISPLAY USING THE SAME

(75) Inventor: Jee-youl Ryu, Suwon (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1035 days.

(21) Appl. No.: 11/898,513

(22) Filed: Sep. 12, 2007

(65) Prior Publication Data

US 2008/0111649 A1 May 15, 2008

(30) Foreign Application Priority Data

Nov. 9, 2006 (KR) .................. 10-2006-0110576

(51) Int. Cl.
*G09G 5/00* (2006.01)
(52) U.S. Cl. .................. 345/204; 345/55; 333/17.3
(58) Field of Classification Search .................. 345/204, 345/55, 214
See application file for complete search history.

(56) References Cited

U.S. PATENT DOCUMENTS

| 6,967,528 B2 | 11/2005 | Takagi |
| 7,106,095 B2 | 9/2006 | Kim et al. |
| 7,236,018 B1 * | 6/2007 | Wang et al. .................. 327/108 |
| 7,352,207 B2 * | 4/2008 | Garlapati et al. .............. 326/68 |

FOREIGN PATENT DOCUMENTS

| KR | 10-0191781 B1 | 1/1999 |
| KR | 10-2004-0051499 A | 6/2004 |
| KR | 10-2004-0102676 A | 12/2004 |
| KR | 10-2005-0113476 | 12/2005 |

* cited by examiner

*Primary Examiner* — Kevin Nguyen
*Assistant Examiner* — Kenneth B Lee, Jr.
(74) *Attorney, Agent, or Firm* — Lee & Morse, P.C.

(57) ABSTRACT

A differential signaling system includes a pair of differential signal lines having a transmitting end and a receiving end, and a termination resistor and an active impedance compensator connected in parallel between the pair of differential signal lines at the receiving end, wherein the active impedance compensator includes a plurality of impedance adjustment circuits connected in parallel between the pair of differential signal lines.

14 Claims, 4 Drawing Sheets

DIFFERENTIAL SIGNALING SYSTEM AND DISPLAY USING THE SAME

BACKGROUND OF THE INVENTION

1. Field of the Invention

Embodiments relate to a differential signaling system and a display using the same and, more particularly, to differential signaling system including an active impedance matching system, and a display including the same.

2. Description of the Related Art

Modern displays, including, e.g., flat panel displays such as liquid crystal displays (LCDs), plasma display panels (PDPs), field emission displays (FEDs) and organic light emitting diode (OLED) displays, have been developed to display images of higher and higher resolutions, while at the same time being driven at increasing frequencies. Such developments have resulted in displays that may need to rapidly manage large numbers of signals, which may be transmitted between various components using various parts and wiring lines.

In particular, with advances in electronic circuit technology and manufacturing processes, signals may be transmitted through the lines at high speed and at high frequencies in order to cope with the high rate of signal transmission. One technique that has been proposed for transmitting signals through the lines is a differential signaling technique, e.g., low-voltage differential signaling, reduced-swing differential signaling, etc.

A signaling system adopting the differential signaling technique may transmit a differential mode signal of a same size but opposite polarity through a differential transmission line. That is, complementary signals of opposite polarity may be simultaneously applied to a pair of differential signal lines that couple a signal-transmitting component to a signal-receiving component. Such a signaling system may reduce or eliminate concentrated magnetic fields and may couple electric fields, which may allow signals to be effectively transmitted at high speed while reducing signal reflection, skew, phase delay, electro magnetic interference (EMI), etc.

One problem affecting differential signaling is impedance mismatch, e.g., between differential signaling lines and the components they are connected to. Such impedance mismatch may be attenuated to a degree through the use of a resistor and a capacitor having predetermined values that are installed between a pair of differential signaling lines. However, the effectiveness of such an approach is limited by the fact that the resistance and capacitance values must be predetermined, i.e., fixed, and thus cannot be adjusted to take into account manufacturing or operational variables of the display. Accordingly, there is a need for a differential signaling system and a display using the same that are not limited to an impedance matching parameter that is fixed at the time of manufacture.

SUMMARY OF THE INVENTION

Embodiments are therefore directed to a differential signaling system and a display using the same, which substantially overcome one or more of the problems due to the limitations and disadvantages of the related art.

It is therefore a feature of an embodiment to provide a differential signaling system that includes an active impedance compensator, which may be programmable to match an impedance of a pair of differential signal lines.

It is therefore another feature of an embodiment to provide a display including an active impedance compensator, the active impedance compensator operable to adjust impedance of a data driver connected to a pair of differential signal lines.

At least one of the above and other features and advantages may be realized by providing a differential signaling system, including a pair of differential signal lines having a transmitting end and a receiving end, and a termination resistor and an active impedance compensator connected in parallel between the pair of differential signal lines at the receiving end, wherein the active impedance compensator includes a plurality of impedance adjustment circuits connected in parallel between the pair of differential signal lines.

The active impedance compensator may include a plurality of n switches each connected between a first power source line and a second power source line, a first plurality of n capacitors, each having a first electrode connected to a first electrode of a corresponding switch and having a second electrode connected to one of the pair of differential signal lines, and a second plurality of n capacitors, each having a first electrode connected to a second electrode of a corresponding switch and having a second electrode connected to the other of the pair of differential signal lines. The differential signaling system may further include a first plurality of n resistors, each connected between the first power source line and the first electrode of a corresponding switch, and a second plurality of n resistors, each connected between the second power source line and the second electrode of a corresponding switch. The active impedance compensator may have n impedance adjustment circuits, and each impedance adjustment circuit may include one switch of the n switches, one capacitor of the first plurality of n capacitors, one capacitor of the second plurality of n capacitors, one resistor of the first plurality of n resistors, and one resistor of the second plurality of n resistors.

Each resistor of the first and second pluralities of resistors may have a resistance of several kΩ. The number n of the switches may be equal to a number of digital bits of control signals controlling the active impedance compensator. Each switch may be a transistor having a minimum distributed gate voltage. Each capacitor of the first and second pluralities of capacitors may have a capacitance of about (2/n)Cb, where Cb is the capacitance of the pair of differential signal lines.

Each impedance adjustment circuit may include a sequence of a first resistor, a switch, and a second resistor connected in series between a first power source line and a second power source line, a first capacitor having a first electrode connected to a node between the first resistor and the switch, and having a second electrode connected to one of the pair of differential signal lines, and a second capacitor having a first electrode connected to a node between the second resistor and the switch, and having a second electrode connected to the other of the pair of differential signal lines.

At least one of the above and other features and advantages may also be realized by providing a display, including a display panel having a plurality of data lines and a plurality of scan lines respectively coupled to a plurality of pixels, a data driver coupled to the plurality of data lines and coupled to at least one pair of differential signal lines, and a controller transmitting a signal to the data driver over the pair of differential signal lines, wherein a termination resistor is connected between the pair of differential signal lines, the data driver includes an active impedance compensator connected in parallel with the termination resistor between the pair of differential signal lines, and the active impedance compensator includes a plurality of impedance adjustment circuits connected in parallel between the pair of differential signal lines.

The active impedance compensator may be part of a data driving integrated circuit. The controller may be configured to transmit an image signal to the data driver over the pair of differential signal lines. The active impedance compensator may include n impedance adjustment circuits, the data driver may be configured to receive an n bit active impedance compensator programming signal, and the active impedance compensator may be configured to actively match impedance of the data driver to impedance of the differential signal lines in response to the active impedance compensator programming signal. The active impedance compensator may actively adjust impedance of the data driver during operation of the display. The active impedance compensator may actively match impedance of the data driver to impedance of the pair of differential signal lines by varying a number of switches that are closed during operation of the display.

The active impedance compensator may include a plurality of n switches each connected between a first power source line and a second power source line, a first plurality of n capacitors, each having a first electrode connected to a first electrode of a corresponding switch and having a second electrode connected to one of the pair of differential signal lines, and a second plurality of n capacitors, each having a first electrode connected to a second electrode of a corresponding switch and having a second electrode connected to the other of the pair of differential signal lines. The display may further include a first plurality of n resistors, each connected between the first power source line and the first electrode of a corresponding switch, and a second plurality of n resistors, each connected between the second power source line and the second electrode of a corresponding switch.

Each resistor of the first and second pluralities of resistors may have a resistance of several kΩ. The number n of the switches may be equal to a number of digital bits of control signals controlling the active impedance compensator. Each capacitor of the first and second pluralities of capacitors may have a capacitance of about (2/n)Cb, where Cb is the capacitance of the pair of differential signal lines.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Figure 1:
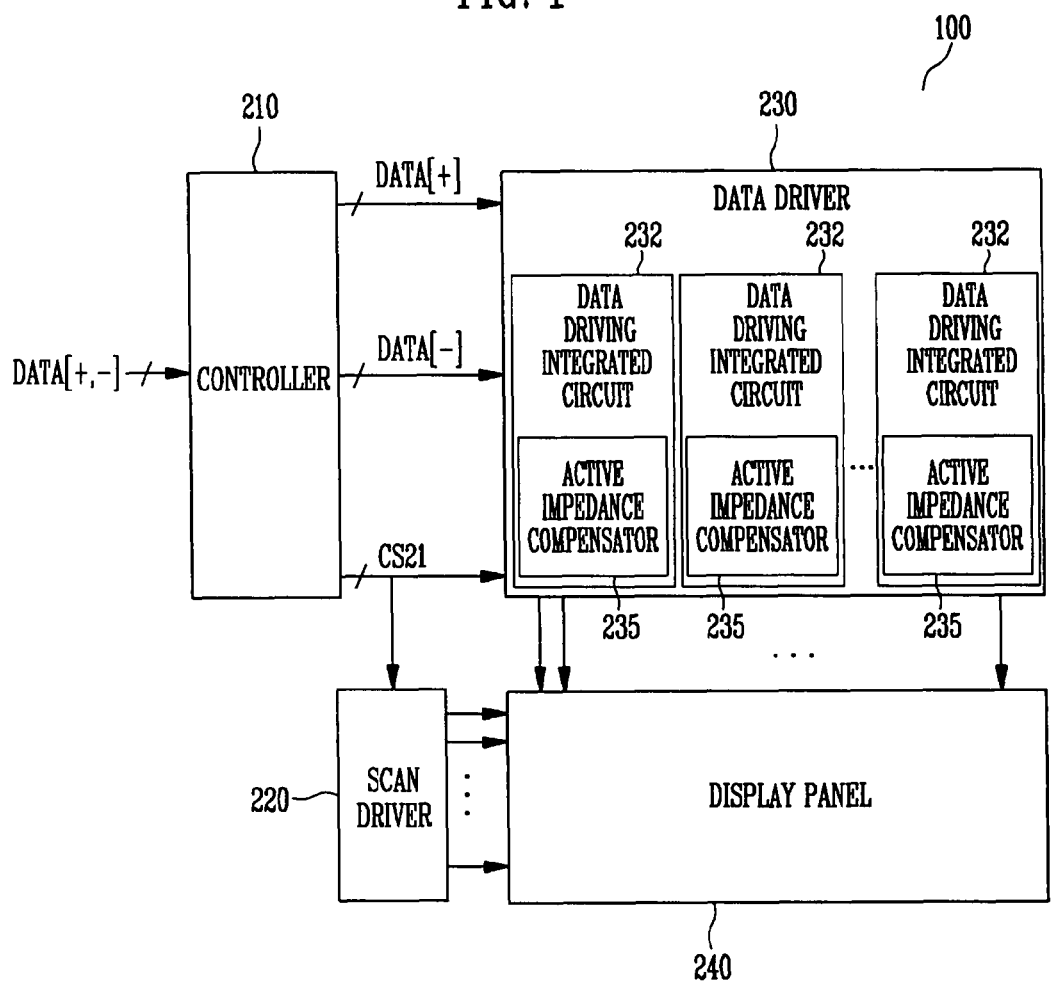
FIG. 1 illustrates a schematic view of a display according to an embodiment.

Korean Patent Application No. 10-2006-0110576, filed on Nov. 9, 2006, in the Korean Intellectual Property Office, and entitled: "Differential Signaling System and Flat Panel Display Using The Same," is incorporated by reference herein in its entirety.

Embodiments will now be described more fully hereinafter with reference to the accompanying drawings; however, they should not be construed as limited to the embodiments set forth herein. Rather, these embodiments are provided so that this disclosure will be thorough and complete, and will fully convey the scope of the invention to those skilled in the art.

Where an element is described as being connected to a second element, the element may be directly connected to second element, or may be indirectly connected to second element via one or more other elements. Further, where an element is described as being connected to a second element, it will be understood that the elements may be electrically connected, e.g., in the case of transistors, capacitors, power supplies, nodes, etc. In the figures, the dimensions of regions may be exaggerated and elements may be omitted for clarity of illustration. Like reference numerals refer to like elements throughout.

FIG. 1 illustrates a schematic view of a display 100 according to an embodiment. Referring to FIG. 1, the display 100 may include a display panel 240 having scan lines and data lines arranged so as to intersect with each other in a pixel region. The display 100 may further include a scan driver 220, which may sequential supply scan signals to scan lines of the display panel 240, and a data driver 230, which may supply data signals to data lines of the display panel 240. The display 100 may also include a controller 210, which may receive data from, e.g., an external graphics controller (not shown), and which may supply differential data signals (DATA[+,−]) to the data driver 230. The controller 210 may control driving timing by supplying control signals CS21 to the scan driver 220 and the data driver 230.

The display 100 according to this embodiment may further include one or more programmable active impedance compensators 235. The active impedance compensator 235 may enable a differential signaling technique by impedance matching differential signaling lines in the display. In particular, the active impedance compensator 235 may actively compensate for variations in differential impedance, which may allow for more precise impedance matching while at the same time avoiding the disadvantages of conventional impedance matching techniques that rely on predetermined resistance and capacitance values. In an implementation, the active impedance compensator 235 may be provided at a receiving end of the data transmission line, e.g., as part of the data driver 230.

In the display panel 240, a plurality of scan lines may be arranged so as to be constantly spaced from each other in a transverse direction, and a plurality of data lines may be arranged so as to be constantly spaced from each other in a longitudinal direction. The scan lines and the data lines may intersect each other in a plurality of regions, i.e., pixels. The pixels may be connected to the scan lines and the data lines, and may be arranged on the display panel 240 in a matrix form.

The controller 210 may be a timing controller that receives data from an external source and generates control signals CS21 for driving the display. The controller 210 may supply differential data signals (DATA [+, −]) to the data driver 230, and may supply the control signals CS21 to the scan driver 220 and the data driver 230 to control driving timing. The controller 210 may supply a vertical synchronization signal VSYNC, a horizontal synchronization signal HSYNC, a clock signal, a scan start signal, and a data enable signal, etc., as the control signals CS21 to the scan driver 220 and the data driver 230 to control the driving timings of the scan driver 220 and the data driver 230.

Thus, the controller 210 may supply the horizontal synchronization signal and the scan start signal to the scan driver 220, which may sequentially supply the scan signals to the scan lines of the display panel 240. The controller 210 may further supply the horizontal synchronization signal HSYNC, the data enable signal, and the differential data signals (DATA [+, −]) to the data driver 230, which may supply data signals to the pixels in concert with the scan signals, thereby controlling the driving timings of the scan driver 220 and the data driver 230.

The data driver 230 may be electrically connected to the display panel 240 through the data lines. The data driver 230 may include a plurality of data driving integrated circuits 232. Each data driving integrated circuit 232 may receive the differential data signals (DATA[+, −]) and the control signals (CS21), and may output data signals to respective data lines.

Each of the input stages of the data driving integrated circuits 232 supplied with the differential data signals (DATA [+, −]) from the controller 210 may be provided with a respective active impedance compensator 235 for impedance matching. The respective active impedance compensators 235 may actively adjust an impedance characteristic so as to match the differential impedance of the controller 210 to the data driver 232, such that the differential data signals (DATA [+, −]) may be smoothly transmitted. Additional details of the constitution and operation of the active impedance compensator 235 will be described below.

The scan driver 220 may receive the control signals CS21 from the controller 210 and then sequentially supply the scan signals to the scan lines to drive the pixels arranged in a matrix form, and the data driver 230 may supply the data signals through the data lines to the pixels in concert with the scan signals. Thus, the display may sequentially scan all the scan lines of the display panel 240, may supply the data signals to the pixels through the data lines to display one frame of an image and may supply the vertical synchronization signal VSYNC to display a next frame of the image.

Figure 2:
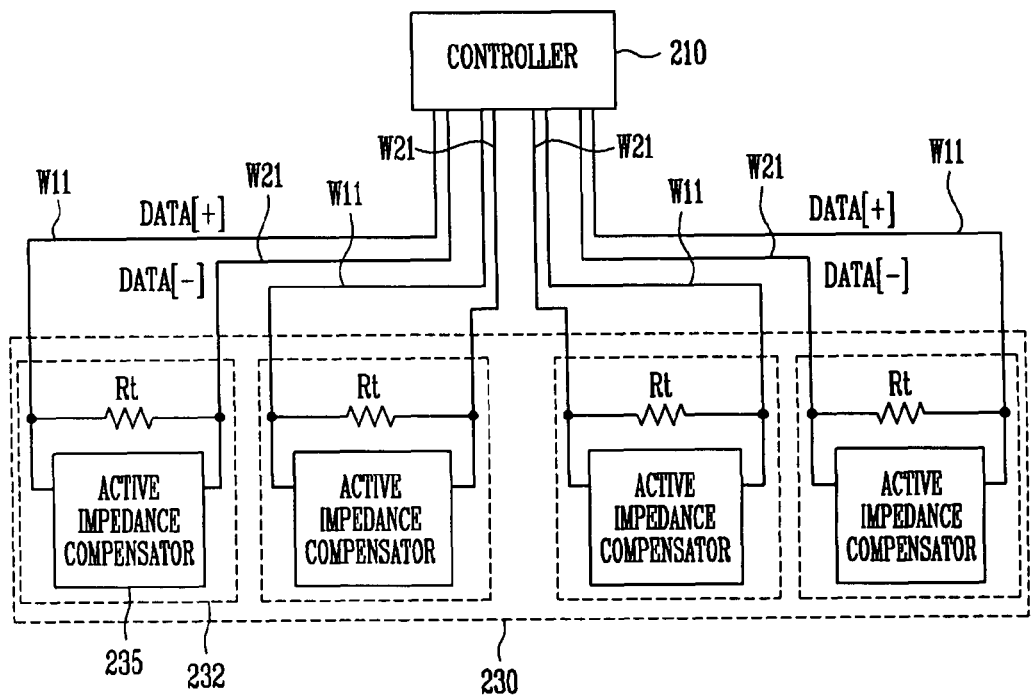
FIG. 2 illustrates a controller and a data driver shown in FIG. 1.
Figure 3:
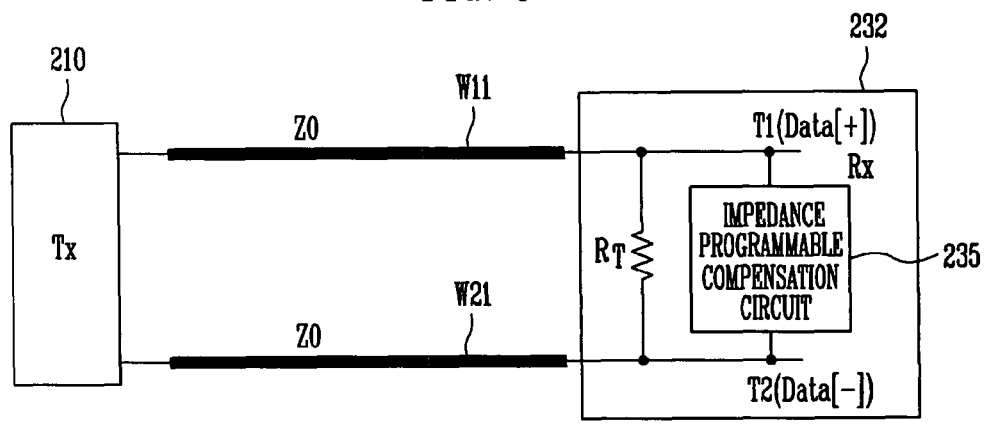
FIG. 3 illustrates a schematic of a differential signaling system according to an embodiment.
Figure 4:
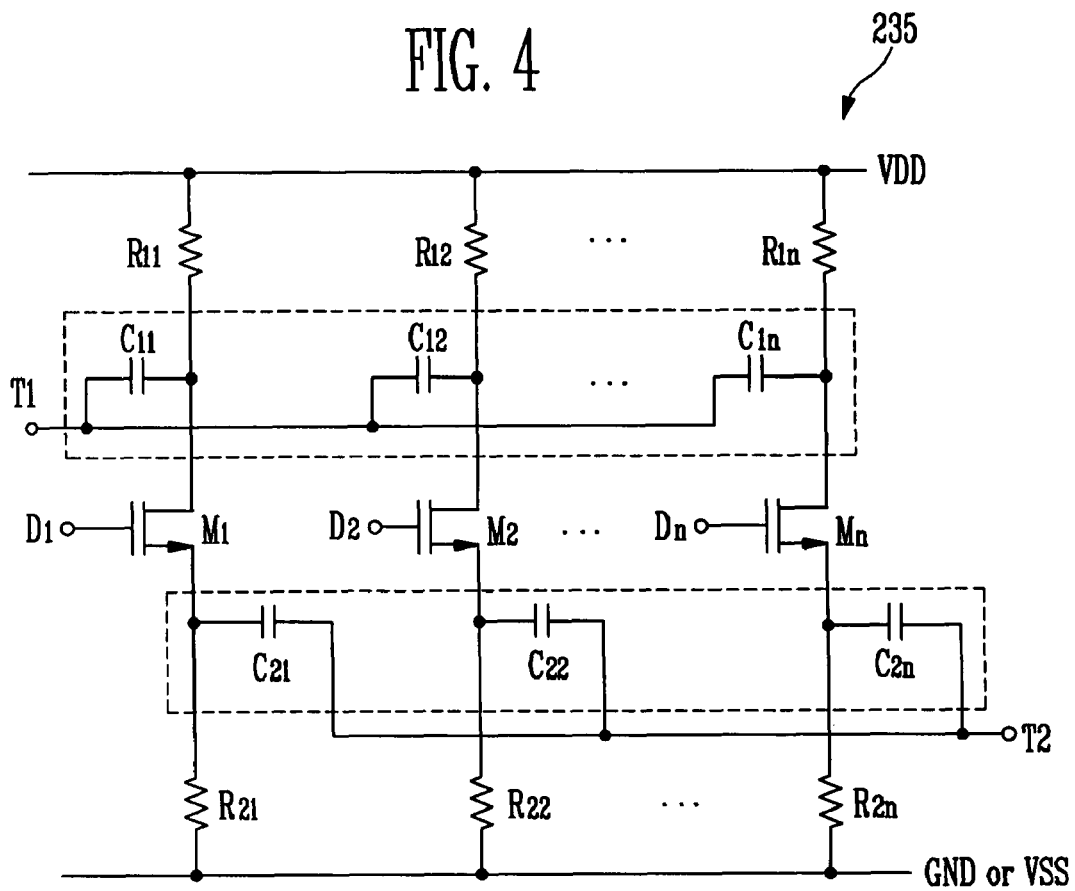
FIG. 4 illustrates a circuit view of an active impedance compensator shown in FIG. 3.

FIG. 2 illustrates a controller and a data driver shown in FIG. 1, and FIG. 3 illustrates a schematic of a differential signaling system according to an embodiment. FIG. 3 is a view for explaining a signaling method between the controller and the data driver shown in FIG. 2. FIG. 4 illustrates a circuit view of an active impedance compensator circuit shown in FIG. 3

Referring to FIG. 2, the controller 210 may receive image data from an external source and output differential data signals (DATA [+, −]) to first and second differential signaling lines W11 and W21. The data driver 230 may have a plurality of data driving integrated circuits receiving the differential data signals (DATA [+, −]). The data driving circuits may be impedance-matched with the impedance of the first and the second lines W11 and W21 from the controller 210.

The controller 210 and the data driving integrated circuits 232 may perform the transmission of the image signals and the control signals by, for example, a low voltage differential signaling (LVDS) method, in order to transmit the signals at high speed. The controller 210 may be electrically connected to the data driver 230 through the first and the second lines W11 and W21. The data driver 230 may include the data driving integrated circuits 232, wherein each of the data driving integrated circuits 232 receives the differential data signals (DATA [+, −]) and/or the control signals from the controller 210 through the first and the second lines W11 and W21. Note that, in FIG. 2, the lines supplying the control signals are omitted for clarity. Thus, although only one pair of the first and the second lines W11 and W21 is illustrated as being connected to each of the data driving circuits 232, a plurality pairs of the first and the second lines W11 and W21 may be connected to each of the data driving integrated circuits 232.

The data driving integrated circuits 232 may be connected to the first and the second lines W11 and W21. The first and the second lines W11 and W21 may be connected to each other by the active impedance compensator 235 and a parallel termination resistor Rt to constitute a closed loop. The active impedance compensator 235 and termination resistor Rt connected in parallel may be located at the receiving end, i.e., the data controller 230 end, of the first and second lines W11 and W21.

The differential data signals (DATA [+, −]) supplied from the controller 210 may be applied to the active impedance compensator 235 and parallel termination resistor Rt as a voltage to be supplied to the data driving integrated circuits 232. The active impedance compensator 235 and parallel termination resistor Rt may prevent excessive current from flowing to the data driving integrated circuits 232 and may supply a voltage indicating the differential data signals (DATA [+, −]) to the data driving integrated circuit 232.

Referring to FIG. 3, between a sending end (Tx, controller 210) and a receiving end (Rx, data driving integrated circuits 232) may be provided a differential transmission line structure (the first and second lines W11 and W21) in order to transmit one data group (DATA [+, −]). Meanwhile, between the differential transmission lines on the side of the receiving end (data driving integrated circuits 232) may be provided the active impedance compensator 235 and the parallel termination resistor Rt, wherein the active impedance compensator 235 and parallel termination resistor Rt configure a closed loop by connecting the first and the second lines W11 and W21.

Additional details of the active impedance compensator 235 will be now described with reference to FIG. 4. Referring to FIG. 4, the active impedance compensator 235 may include a plurality of impedance adjustment circuits connected in parallel between the pair of differential signal lines. The active impedance compensator 235 may include first and second terminals T1 and T2, which may be respectively connected to the first and second lines W11 and W21. In detail, the active impedance compensator 235 may include a plurality of n switches (M1, M2, . . . , Mn), e.g., n transistors, which may be connected between a first power source line, e.g., VDD, and a second power source line, e.g., GND or VSS. The number n of switches may be one or more, i.e., n may be an integer that is greater than or equal to one.

The active impedance compensator 235 may further include a first plurality of n capacitors (C11, C12, . . . , C1n), each having a first electrode connected to a first electrode of a respective switch and second electrode connected to the first differential signaling line W11 (terminal T1), and a second plurality of n capacitors (C21, C22, . . . , C2n), each having a first electrode connected to a second electrode of the respective switch and a second electrode connected to the second differential signaling line W21 (terminal T2). The active impedance compensator 235 may further include a first plurality of n resistors (R1, R12, . . . , R1n) connected between the first power source line and the first electrodes of the respective switches, and a second plurality of n resistors (R21, R22, . . . , R2n) connected between the second power source line and the second electrodes of the respective switches. The number n of capacitors in the first plurality of capacitors may be equal to the number n of switches. Similarly, the number n of capacitors in the second plurality of capacitors may be equal to the number n of switches, the number n of resistors in the first plurality of resistors may be equal to the number n of switches, and the number n of resistors in the second plurality of resistors may be equal to the number n of switches.

The number n of switches may correspond to a predetermined degree of impendence-matching control, e.g., i.e., a number of bits. Control signals provided to the active impedance compensator 235 may have a number of bits corresponding to the number of switches. For example, if the active impedance compensator 235 is to be operated at 8 bits, the number n of switches may be 8. For convenience, in the following descriptions, the active impedance compensator 235 using an exemplary implementation of n=8 bits of control, although it will be appreciated that a greater or lesser number of bits/switches may be used.

Where the switches (M1, M2, ..., Mn) are transistors, the transistors may be designed to minimize distributed gate resistance, thereby minimizing an influence from thermal noise. The distributed gate resistance may be minimized by, e.g., making a width-to-length (W/L) aspect ratio of the gate as high as possible, or by applying a bias voltage in order that a voltage between the gate and a source be reduced as much as possible. Further, the transistors may be operated in a deep triode region without having any DC offset between input voltage and output voltage.

The capacitance values of the first n capacitors (C11, C12, ..., C1n) and the second n capacitors (C21, C22, ..., C2n) may be the same as $(2/n)Cb$, where Cb is the capacitance values of the differential transmission lines W11 and W21. Thus, if the active impedance compensator 235 is operated at 8 bits, 8 first capacitors and 8 second capacitors may be provided, and each capacitance value thereof may be $(1/4)Cb$.

The first resistors (R11, R12, ..., R1n) connected between the first power source line and the first electrodes of each of the switches, and the second resistors (R21, R22, ..., R2n) connected between the second power source line and the second electrodes of each of the switches, may have large resistance values, e.g., several kΩ.

Power provided to the first power source line and the second power source line may be supplied to normally operate the n switches connected between the first and the second power source lines, i.e., , to prevent the switches from being floated.

FIGS. 5A to 5D illustrate views for explaining the active impedance compensator shown in FIG. 4. As shown in FIGS. 5A to 5D, 0V may be applied to each switch in an alternating current equivalent circuit.

Figure 5A:
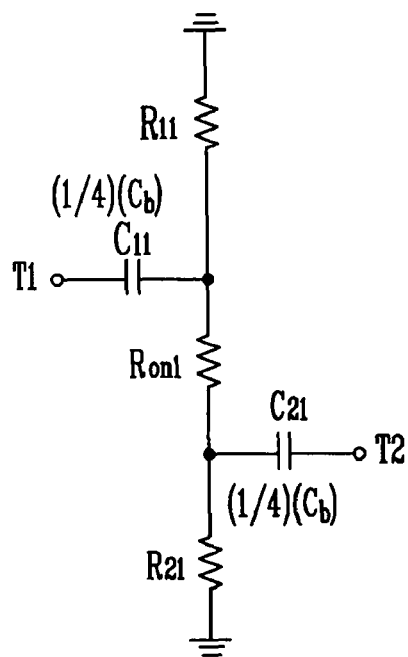
FIGS. 5A to 5D illustrate circuit views for explaining the active impedance compensator shown in FIG. 4.

FIG. 5A illustrates an alternating current equivalent circuit in the state where only M1 of 8 switches is turned on and all of the remaining switches are turned off, the 8 bit control signals (D8, D7, ..., D1) being applied to the active impedance compensator are (0, 0, ..., 1). The control signals (D8, D7, ..., D1) may be provided by an analog-to-digital converter (ADC). In an implementation, the ADC may be in the data driver 230.

In FIG. 5A, it will be assumed that each of the first capacitor C11 and the second capacitor C21 has the capacitance value of $(1/4)$ Cb, and the equivalent resistor Ron1, which has a very small value, corresponds to the turned-on resistance of the switch M1. Referring to Equation 1 below, if all of the first resistor R11, the second resistor R21 and the resistor Ron1 satisfy Equation 1, the current flowing into the resistors R11 and the R21 can be ignored due to a large resistance value of the resistors R11 and R21. Likewise, the voltage drop in the equivalent resistor Ron1 can be ignored due to its very small resistance value of the equivalent resistor Ron1.

$$R11=R21, \ldots, R18=R28 \gg 4/\omega Cb \quad \text{[Equation 1]}$$

and $$Ron1, \ldots, Ron8 \ll 4/\omega Cb$$

Figure 5B:
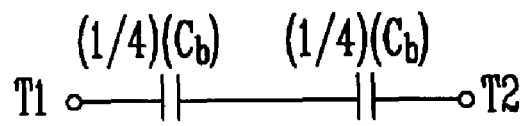
Figure 5C:
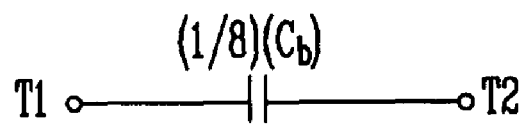

Consequently, the alternating current equivalent circuit of FIG. 5A may be represented as an equivalent circuit as shown in FIG. 5B, and its capacitance value becomes $(1/8)Cb$ as the combined capacitance of serially-connected capacitors, as shown in FIG. 5C. Thus, in the case that the control signals (D8, D7, ..., D1) input to the active impedance compensator 235 are (0, 0, ..., 1), the capacitance value of the active impedance compensator becomes $(1/8)Cb$.

Figure 5D:
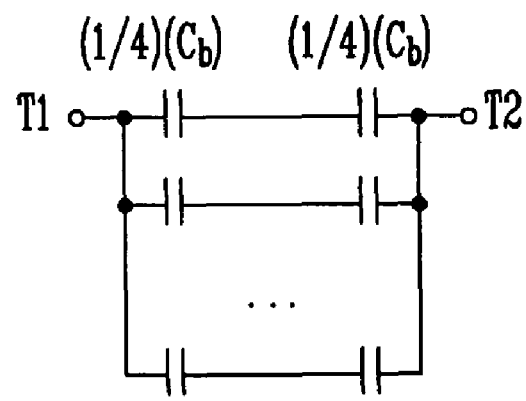

If the control signals (D8, D7, ..., D1) input to the active impedance compensator are (1, 1, ..., 1), that is, all the 8 switches (M1, M2 ..., M8) are turned on, the equivalent circuit may be is represented by the alternating current equivalent circuit as shown in FIG. 5D, and the whole capacitance of the active impedance compensator 235 becomes Cb according, as the combined capacitance of 8 parallel-connected capacitors each having a capacitance of $(1/8)Cb$. Thus, when the control signals (1, 1, ..., 1) are input to the active impedance compensator, the capacitance value of the active impedance compensator becomes Cb.

According to this embodiment, the active impedance compensator 235 may be connected to the termination resistor Rt in parallel. The active impedance compensator 235 may programmably control the impedance value of the receiving end Rx, i.e., the data driving integrated circuit 232, corresponding to a differential impedance value of the differential signaling lines, such that impedance matching may be performed accurately. In an implementation, the active impedance compensator 235 may control the impedance value upon initial startup of the display. Thus, these embodiments may avoid the problems of conventional systems, wherein only a predetermined termination resistor and capacitor are connected between the differential transmission lines and impedance matching is not effectively performed due to variations in the differential impedance Zdiff.

A reflection coefficient (Γ) of a system without the active impedance compensator 235 is represented by Equation 2 below, and the reflection coefficient (Γ) of the system with the active impedance compensator 235 according to an embodiment shown in FIG. 3 is represented by Equation 3 below.

$$\Gamma = \frac{Zdiff - Rt}{Zdiff + Rt} \quad \text{[Equation 2]}$$

$$\Gamma = \frac{\overline{Zdiff} - Ztn}{\overline{Zdiff} + Ztn} \quad \text{[Equation 3]}$$

Referring to Equation 2, Zdiff is the impedance towards the source, which the termination resistor Rt is intended to balance in the conventional system. If an impedance value of the differential signaling lines W11 and W21 does not match the impedance value of the data driving integrated circuit 232 connected thereto, an impedance mismatch occurs, in which case differential data signals supplied through the differential signaling lines may be reflected. In particular, as can be seen from Equation 2, when the value of the termination resistor Rt is equal to Zdiff, the reflection coefficient (Γ) is zero and there is no signal return loss. However, in practice, the differential impedance Zdiff may vary depending on, e.g., manufacturing process variables and/or operational characteristics of the display. Accordingly, the conventional approach of relying solely on a predetermined resistor and capacitor may not result in accurate impedance matching, e.g., Zdiff may be lower than the sum 2Z0 of the differential signaling lines W11 and W21, in which case reflected waves may occur that interfere with the differential data signals (DATA [+, −]) supplied to the differential signaling lines. The interference may cause the signal waveforms to be unstable, thereby causing signal distortion, attenuation and electro magnetic interference (EMI) that degrades image quality of the display.

Referring to Equation 3, $\overline{Zdiff}$ is varying differential impedance towards the source, and Ztn is a resultant impedance of the active impedance compensator 235 and the termination resistor Rt connected in parallel. The parallel resultant impedance Ztn may be represented by Equation 4 below.

$$Ztn = \frac{nRt}{n + j\omega RtCb} \quad [\text{Equation 4}]$$

$$= \frac{n^2 Rt}{n^2 + (\omega RtCb)^2} - j\omega \frac{nRt^2 Cb}{n^2 + (\omega RtCb)^2}$$

In Equation 4, n is the number of bits of digital control signals input to the active impedance compensator 235, i.e., the number of switches, Rt is the resistance value of the termination resistor, and Cb is the capacitance value of the differential signaling line.

The varying differential impedance $\overline{Zdiff}$ may have a value lower than the sum of the impedance values Z0 of the first and the second lines, that is, 2Z0, and may have different values depending on, e.g., manufacturing process variables, operational characteristics, etc. However, in this embodiment, the value of Ztn may be varied by the operation of the active impedance compensator 235 so that the variations of the differential impedance $\overline{Zdiff}$ may be compensated. Thus, the active impedance compensator 235 may be set so as to make the magnitudes of Ztn and $\overline{Zdiff}$ equal, in which case the reflection coefficient is 0 and return losses in the differential data signals are eliminated.

In an implementation, optimization of the differential impedance may be performed by comparing the impedance value with a reference value, e.g., Zref=100 ohm. The reference value Zref may be stored in a look-up table, which may be part of the data driver IC. In operation, impedance compensation may be performed when the impedance varies from Zref by, e.g., more than ±10%, and may not be performed when the impedance variation is less than that amount.

As described above, the termination resistor Rt provided for each of the data driving integrated circuits 232 may be connected to the active impedance compensator 235 in parallel to implement accurate impendence matching of the impedance value of these components with the differential impedance value $\overline{Zdiff}$ of the first and the second lines W11 and W21 connected to the data driving integrated circuits 232. As a result, signal reflections, loss and degradation, electromagnetic interference (EMI), etc., may be reduced or prevented in the differential data signals (DATA [+, −]) applied through the first and the second lines W1 and W2. Accordingly, differential data signals (DATA [+, −]) having a stable waveform may be smoothly supplied to the data driving integrated circuits 232 from the controller 210, thereby avoiding degradation of image quality. As the capacitance value may be controlled according to the n-bit control signals, the active impedance compensator 235 may control the parallel resultant impedance value Ztn to be identical with the differential impedance value $\overline{Zdiff}$, as described in Equations 2 and 3, such that the reflection coefficient becomes zero and return losses are removed from the signal.

Also, as described above, the active impedance compensator 235 may be connected in parallel with the termination resistor Rt for each of the data driving integrated circuits 232 so as to implement the accurate impendence matching of the impedance value of the data driving integrated circuits 232 to the differential impedance value of the first and the second lines W11 and W21. As a result, image signals to be applied through the first and the second lines W11 and W21 without being reflected, which could cause loss of the image signals, distortion by reflected waves, or the generation of electromagnetic interference (EMI). Accordingly, since the image signals having a stable waveform may be smoothly applied to the data driving integrated circuits from the controller 210, it may be possible to prevent degradation of image quality.

Further, as described above, according to an embodiment, the programmable compensation circuit 235 for performing impedance matching in a differential signaling method, in order to compensate for variations of differential impedance, may be provided at a receiving end of differential signaling wiring, e.g., inside of the data driving integrated circuit 232, so that the impedance matching is more accurately performed, which may further enable safe transmission of a signal at high speed without having electromagnetic interference (EMI).

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A differential signaling system, comprising:
   a pair of differential signal lines having a transmitting end and a receiving end; and
   a termination resistor and an active impedance compensator connected in parallel between the pair of differential signal lines at the receiving end, wherein the active impedance compensator includes a plurality of impedance adjustment circuits connected in parallel between the pair of differential signal lines,
   wherein each impedance adjustment circuit includes:
   a sequence of a first resistor, a switch, and a second resistor connected in series between a first power source line and a second power source line,
   a first capacitor having a first electrode connected to a node between the first resistor and the switch, and having a second electrode connected to one of the pair of differential signal lines, and
   a second capacitor having a first electrode connected to a node between the second resistor and the switch, and having a second electrode connected to the other of the pair of differential signal lines.

2. The differential signaling system as clamed in claim 1, wherein each resistor of the first and second pluralities of resistors has a resistance of several kΩ.

3. The differential signaling system as clamed in claim 1, wherein a number n of the impedance adjustment circuits is equal to a number of digital bits of control signals controlling the active impedance compensator.

4. The differential signaling system as clamed in claim 1, wherein each switch is a transistor having a minimum distributed gate voltage.

5. The differential signaling system as clamed in claim 1, wherein each of the first and second capacitors has a capacitance of about (2/n)Cb, where Cb is the capacitance of the pair of differential signal lines.

6. A display, comprising:
   a display panel having a plurality of data lines and a plurality of scan lines respectively coupled to a plurality of pixels;
   a data driver coupled to the plurality of data lines and coupled to at least one pair of differential signal lines; and a controller transmitting a signal to the data driver over the pair of differential signal lines, wherein:

a termination resistor is connected between the pair of differential signal lines, the data driver includes an active impedance compensator connected in parallel with the termination resistor between the pair of differential signal lines, and the active impedance compensator includes a plurality of impedance adjustment circuits connected in parallel between the pair of differential signal lines, wherein each impedance adjustment circuit includes:

a sequence of a first resistor, a switch, and a second resistor connected in series between a first power source line and a second power source line, a first capacitor having a first electrode connected to a node between the first resistor and the switch, and having a second electrode connected to one of the pair of differential signal lines, and a second capacitor having a first electrode connected to a node between the second resistor and the switch, and having a second electrode connected to the other of the pair of differential signal lines.

7. The display as claimed in claim 6, wherein the active impedance compensator is part of a data driving integrated circuit.

8. The display as claimed in claim 6, wherein the controller is configured to transmit an image signal to the data driver over the pair of differential signal lines.

9. The display as claimed in claim 6, wherein the active impedance compensator includes n impedance adjustment circuits, the data driver is configured to receive an n bit active impedance compensator programming signal, and the active impedance compensator is configured to actively match impedance of the data driver to impedance of the differential signal lines in response to the active impedance compensator programming signal.

10. The display as claimed in claim 9, wherein the active impedance compensator actively adjusts impedance of the data driver during operation of the display.

11. The display as claimed in claim 10, wherein the active impedance compensator actively matches impedance of the data driver to impedance of the pair of differential signal lines by varying a number of switches that are closed during operation of the display.

12. The display as claimed in claim 6, wherein each resistor of the first and second pluralities of resistors has a resistance of several k$\Omega$.

13. The display as claimed in claim 6, wherein a number n of the impedance adjustment circuits is equal to a number of digital bits of control signals controlling the active impedance compensator.

14. The display as claimed in claim 6, wherein each of the first and second capacitors has a capacitance of about $(2/n)$ Cb, where Cb is the capacitance of the pair of differential signal lines.

* * * * *

(12) SUPPLEMENTAL EXAMINATION CERTIFICATE
United States Patent
Ryu

(10) Number: US 8,018,446 F1
(45) Certificate Issued: Jan. 7, 2016

Control No.: 96/000,123  
Filing Date: Dec. 4, 2015
Primary Examiner: Christina Y. Leung No substantial new question of patentability is raised in the request for supplemental examination. See the Reasons for Substantial New Question of Patentability Determination in the file of this proceeding.

(56) Items of Information

U.S. PATENT DOCUMENTS

| | | |
|---|---|---|
| 7,030,656 B2 | 4/2006 | Lo et al. |
| 6,847,232 B2 | 1/2005 | Tinsley et al. |
| 6,621,308 B2 | 9/2003 | Tinsley et al. |
| 6,252,419 B1 | 6/2001 | Sung et al. |